United States Patent
Pietsch et al.

(10) Patent No.: US 7,077,726 B2
(45) Date of Patent: Jul. 18, 2006

(54) SEMICONDUCTOR WAFER WITH IMPROVED LOCAL FLATNESS, AND METHOD FOR ITS PRODUCTION

(75) Inventors: Georg J. Pietsch, Burghausen (DE); Michael Kerstan, Burghausen (DE); Anton Huber, Burghausen (DE)

(73) Assignee: Siltronic AG, Munich (DE)

( * ) Notice: Subject to any disclaimer, the term of this patent is extended or adjusted under 35 U.S.C. 154(b) by 351 days.

(21) Appl. No.: 10/209,121

(22) Filed: Jul. 31, 2002

(65) Prior Publication Data

US 2003/0060050 A1  Mar. 27, 2003

(30) Foreign Application Priority Data

Aug. 30, 2001 (DE) ................ 101 42 400

(51) Int. Cl.
*B24B 1/00* (2006.01)
*B24B 7/19* (2006.01)
*B24B 7/30* (2006.01)

(52) U.S. Cl. .................... 451/41; 451/268; 451/269
(58) Field of Classification Search ............... 451/269, 451/268, 41; 438/691, 692
See application file for complete search history.

(56) References Cited

U.S. PATENT DOCUMENTS

| | | | |
|---|---|---|---|
| 5,429,711 A | 7/1995 | Watanabe et al. | |
| 5,880,027 A | 3/1999 | Hajime et al. | |
| 5,942,445 A * | 8/1999 | Kato et al. | 438/691 |
| 6,051,498 A * | 4/2000 | Pietsch et al. | 438/691 |
| 6,066,565 A | 5/2000 | Kuroki et al. | |

FOREIGN PATENT DOCUMENTS

| | | |
|---|---|---|
| DE | 198 33 257 | 9/1999 |
| DE | 198 23 904 | 12/1999 |
| EP | 755 751 | 1/1997 |
| EP | 798 405 | 10/1997 |
| EP | 813 931 | 12/1997 |
| EP | 0 868 974 | 10/1998 |
| EP | 971 398 | 1/2000 |
| EP | 1 049 145 | 11/2000 |
| JP | 0 755 751 A1 * | 1/1997 |

OTHER PUBLICATIONS

Patent Abstract of Japan corresponding to JP 08-090401.
J. Haisma et al. (Appl. Opt. 33 (34) (1994) 7945).
English Derwent Abstract AN 1999-519699 corresponding to DE 198 33 257.
English Derwent Abstract AN 2000-015536 corresponding to DE 19823904.

* cited by examiner

*Primary Examiner*—Lee D. Wilson
*Assistant Examiner*—Alvin J. Grant
(74) *Attorney, Agent, or Firm*—Brooks Kushman P.C.

(57) ABSTRACT

A process for producing semiconductor wafers comprises simultaneous grinding of both sides of the semiconductor wafers in a single step, 1S-DDG, wherein this grinding is the only material-removing mechanical machining step which is used to machine the surfaces of the semiconductor wafers. This process produces semiconductor wafers with improved geometry and nanotopology.

3 Claims, 4 Drawing Sheets

SEMICONDUCTOR WAFER WITH IMPROVED LOCAL FLATNESS, AND METHOD FOR ITS PRODUCTION

BACKGROUND OF THE INVENTION

1. Field of the Invention

The invention relates to a semiconductor wafer with improved local flatness (nanotopology), and to a process for producing a semiconductor wafer of this type.

2. The Prior Art

The electronics, microelectronics and microelectromechanics industries are substantially based on the mechanical and chemical shaping, machining and structuring of silicon and a few other semiconductor materials, such as germanium or gallium arsenide to an increasingly fine, complex and reproducible extent. The driving force behind this technology is in particular silicon microelectronics, which, as component integration densities become ever higher, is starting to require structures which are chemically and structurally well defined on a virtually atomic scale. Particularly demanding components, for example microprocessors, typically comprise multilayer-structured component levels which are wired to one another and are separated from one another by insulating interlayers. By now, the central step in the production of multilayer components of this type is virtually exclusively chemical mechanical polishing (CMP), which is used to planarize the interlayers. A high flatness of these interlayers is a condition for the most photolithographic structuring of the next component level. Due to the lateral structure resolution required, which is currently 0.18 µm or 0.13 µm, and exposure wavelengths of below 200 nm, lithography has an extremely low exposure focus depth and therefore only functions on extremely flat exposure surfaces. To ensure that the CMP process does not break through the insulating layer and attack the components below it or thin structures which have been created so that their dimensions become uneven, even the starting surface, i.e. the surface of the silicon substrate base, has to be as perfectly flat as possible.

Until a few years ago, the flatness values required for the substrate wafers were only globally defined and specified for the overall wafer or for the surface area taken up by individual components. For example, the characteristic variable TTV (total thickness variation) indicates the deviation in the wafer thickness over the entire area of the wafer. On the other hand, the characteristic variable SFQR (site focal-plane least-square deviation range (peak to valley)) relates to the extent of individual component assemblies (sites; exposure points; e.g. a microprocessor with an area of, for example, 25 mm×25 mm). In addition to these long-range characteristic variables, there have also been, and still are, stipulations for the short-range (atomic) roughness on the length scale of the individual components, since the residual roughness of the starting surface directly affects the functioning of the individual components which are structured on this starting surface and formed therefrom. With the advent of the CMP process for planarizing of the component interlayers in multilayer components on a large scale, in addition to these traditional, in particular short-range and long-range stipulation areas, maximum residual unevennesses in the millimeter range and slightly above are now also specified. Structures within this scope are referred to as nanotopology.

The term "nanotopology" or "nanotopography" is defined more accurately by SEMI (Semiconductor Equipment and Materials International) as the deviation in planarity of the entire wafer front surface in the region of three-dimensional wavelengths of approximately 0.2 to 20 mm (lateral correlation length) and within the "quality zone" (FQA, "fixed quality area"; surface region for which the wafer properties demanded in the product specification have to be satisfied).

In particular, therefore, features of a wafer which are classified as belonging to the nanotopology differ from other features with variations in height of a comparable order of magnitude by virtue of their characteristic lateral extent (correlation lengths or location frequencies). For example, even nanotopology features with a height (peak to valley) of only 20 nm lead to a change in the thicknesses of film structures which are applied to the semiconductor wafers, having an adverse effect on functioning of the components and appearing during fabrication as uneven coloring (discoloration) of the film.

Good nanotopology is particularly important for a successful CMP process which is used, for example, to level layers of this type. The rigidity of the polishing cloths which are used during the CMP, as well as other process parameters of the CMP, result in preferred smoothing precisely in the nanotopology range. This results in inhomogeneous thinning of component structures on a semiconductor wafer, which is associated with poor nanotopology in the CMP process. Consequently, the component characteristic deteriorates, possibly to the extent of a short circuit occurring when the interlayers (dielectrics) are broken through.

The nanotopology is measured by scanning the entire wafer surface, with different sizes of measurement fields, completely and with an overlap. Not one of the variations in the height of the surface (peak to valley) found in each of these measurement fields may exceed the required maximum for the entire wafer. The measurement-field sizes are dependent on specification and are described, for example, as 2 mm×2 mm, 5 mm×5 mm and 10 mm×10 mm. For these measurement fields, for example in the case of a 0.13 µm minimum lateral feature size of the components, maximum height deviations of <20 nm, <30 nm and <50 nm are permitted. Particularly strict demands on the nanotopology apply for demanding very large scale integrated microelectronic components, which are fabricated almost exclusively using the CMP process. Because of the peculiarities of the CMP process, these demands are significantly stricter than the overall, site-referenced and microscopic residual unevenness values, and cannot be achieved, or can only be achieved with an uneconomic yield, with conventional machining sequences for production of the semiconductor wafers.

There is therefore a need to provide a semiconductor wafer whose nanotopology is so good that it satisfies the demands imposed on the starting flatness imposed by the production of particularly demanding microelectronic components, in particular in multilayer technology and with a CMP step, for a 0.13 µm lateral component feature size and below and for wafer diameters of 200 mm and above.

According to the prior art, semiconductor wafers, in particular silicon wafers, are produced, starting from a low-defect monolithic single crystal by a machining sequence which comprises a number of process groups:

a) separating ("sawing") the single crystal into wafers, b) mechanical machining, c) chemical machining, and d) chemical-mechanical machining.

In addition, a wide range of further steps, such as cleaning, classifying, measuring and packaging steps may be carried out, but these have no influence on the flatness of the wafer surface and are therefore not considered in more detail in the text which follows.

According to the prior art, the separation a) is generally carried out by means of an internal-diameter saw (ID), a wire saw (multi-wire saw, MWS), by separation/planarization grinding (grind-slicing, GS), by means of a band saw (single cut) or a web saw (multiple cut).

The mechanical machining b) comprises the rounding of the wafer edge and the planarization of the wafer surface by means of mechanically abrasive, material-removing steps. The edge rounding (edge/notch rounding, ENR) is carried out by grinding or polishing using round, strip-like or similar tools. The planarization of the wafer surface takes place in a batch, i.e. for a plurality of wafers simultaneously, by lapping with unbonded grain using a lapping slurry, or as a single-wafer process by grinding with bonded grain. In the case of grinding, one side of the semiconductor wafer is fixed to a chuck by vacuum and the other side is machined by a grinding disk which is covered with abrasive grain. The machining of the two sides of the semiconductor wafer takes place sequentially. In general, batch double-side grinding processes with lapping kinematics are used, in which bonded abrasive or abrasive which has been applied to coverings (cloth), where it has "nested" in a quasi-fixed state, is located on two large, opposite working disks, between which the semiconductor wafers are ground in a semi-free state, so that they can move on both sides in guide cages, in the same way as during lapping. There is also the process known as "flat honing", in which the working disks are fitted with pellets covered with hard material.

The chemical machining c) comprises one or more cleaning and etching steps. During etching—in batches or for each single wafer—material is removed from both sides, with the object of "deep cleaning", removing the surface zones with damaged crystallinity and reducing the mechanical surface stresses after the mechanical machining. Numerous linear sequences are known which eliminate the etching, since the amount of material removed by etching represents additional consumption of material and increases the overall machining outlay involved in semiconductor wafer manufacture, and moreover is generally associated with a deterioration in the wafer geometry (flatness, dimensional accuracy) which has previously been achieved during the mechanical machining.

The chemical-mechanical machining d) comprises a plurality of polishing steps. According to the prior art, these steps include an optional multistage prepolishing process and a general multistage fine-polishing process. Prepolishing (stock-removal polishing, primary polishing) and fine polishing (haze-free polishing, secondary polishing) may in this case be carried out in the form of a plurality of workpiece clamps on different machines with intervening cleaning, classifying, measuring and other steps, or in integrated machine tools in which the semiconductor wafers are transferred directly to the various polishing plates with different polishing cloths whose properties are in each case optimized for prepolishing and fine polishing.

The polishing step is generally a chemical-mechanical polishing step in which colloidal-disperse, chemically modified silica sol (slurry) removes material partly by mechanical abrasion but predominantly by chemical attack, as a result of a relative movement between the semiconductor wafers and a polishing cloth, this removal of material finishing the planarization of the wafers so that there are few if any crystal defects (geometry) and microscopically smoothing the surface (roughness).

Single-side polishing processes are used for prepolishing and fine polishing, and double-side polishing processes are also used for the prepolishing. In the case of single-side polishing, the semiconductor wafers are bonded on their back surface to a support plate (cement polishing), and are held by a vacuum or adhere by friction to what is known as a rear backing pad (primarily in the case of fine polishing). There are both individual-wafer and batch polishing processes for single-side polishing. The fine polishing is only applied to what will subsequently be the front surface of the semiconductor wafer. Depending on the desired finish of what will subsequently be the wafer back surface, only the front surface is processed during the prepolishing, and consequently the back surface retains the roughness which has been predetermined by the previous processes, or alternatively both sides are processed by sequential single-side polishing or by simultaneous double-side polishing. Double-side polishing is only used for the prepolishing process. The prior art also includes a batch process in which the semiconductor wafers are inserted into thin guide cages in such a manner that they can move semi-freely and are simultaneously polished on both sides between two plates with polishing cloths using lapping kinematics.

Furthermore, the edge of the wafer is generally finish-machined (polished) before the prepolishing. However, other sequences are also known, including those which provide for integrated prerounding (chamfering) and fine-rounding (edge polishing) in a single step.

It is known that a particularly good geometry of the machined wafers can be achieved by using a simultaneous double-side grinding process (double disk grinding, DDG) during the mechanical machining b). However, a common feature of all the machining sequences which have previously been disclosed and include a simultaneous double-side grinding step is that they involve a plurality of mechanical (material-removing) machining steps.

Until now, in principle only machining sequences with a DDG step in which DDG is used either only as a rough preliminary grinding step or in a two-stage process as preliminary grinding and finish-grinding step, have been considered possible and achievable. EP 1 049 145 A1 has disclosed a machining sequence which involves a DDG preliminary grinding step (roughing), followed by one or more (sequential) single-side finish-grinding steps (finishing). By contrast, U.S. Pat. No. 6,066,565 describes the use of the DDG process in a two-stage process with double-side preliminary grinding and double-side finish-grinding. This requires two machines and requires the workpiece to be clamped a number of times.

With the abovementioned machining sequences, the general advantages of DDG machining are obtained at the expense of the drawbacks of mechanical machining in a plurality of steps which has always been considered necessary when using DDG. The multistage partial mechanical machining sequences according to the prior art, which involve one or more DDG steps, have the following considerable drawbacks for the overall machining sequences based thereon:

The consumption of material increases with the number of machining steps. In the case of double-stage or multistage machining, overall more material is removed from the workpiece than when using single-step machining, since grinding-in and grinding-out processes and also the "warm-up grinding" until the thermal equilibrium is established occur a number of times. Moreover, material-removal additions which allow the minimum removal of material which is required for the quality objectives of each individual step to be achieved reliably even with fluctuating initial qualities of the workpieces, have to be applied to the use of material a number of times.

In addition to the amount of material removed, the scrap rate also increases with the number of machining steps, since the yield of each individual step is below 100%.

In addition, long process sequences with a large number of machining steps are distinguished by a low flexibility, poor availability of the overall machining sequence and high throughput times. In general, the overall availability of the machining sequence falls as the number of individual steps increases. To avoid production waste, therefore, it is necessary to keep buffer stores and spare machines.

Overall, therefore, the production costs of semiconductor wafers rise with the number of machining steps. This even applies to the multistage mechanical machining sequences according to the prior art, which include an otherwise advantageous DDG step.

SUMMARY OF THE INVENTION

It is therefore an object of the invention to provide a process for producing semiconductor wafers which satisfies the increasing quality demands for subsequent component fabrication, in particular with regard to nanotopology, and at the same time is as inexpensive, material-saving, rapid and flexible as possible.

The object is achieved by a process for producing semiconductor wafers, including simultaneous grinding of both sides of the semiconductor wafers in a single step, 1S-DDG, wherein this grinding is the only material-removing mechanical machining step used to machine the surfaces of the semiconductor wafers.

In the process according to the invention for producing a semiconductor wafer, the shaping mechanical machining of the surfaces of the semiconductor wafer takes place just once by means of a "one-step simultaneous double-side grinding". ("One-stop simultaneous double-disk grinding", "single-pass simultaneous double-disk grinding", 1S-DDG. The terms "double-disk grinding" and "double-side grinding" are used synonymously in the context of the simultaneous grinding process described.) This is understood as meaning a process which is carried out on a simultaneous double-side grinding machine and only comprises a single machining operation with only one workpiece clamp. This means that the preliminary machining and fine machining ("roughing" and "finishing") which are generally required take place in a single, integrated machining step.

Nevertheless, there are no restrictions with regard to acceptable starting surfaces. It is possible to machine surfaces with all realistic roughnesses and structures from the preceding processes, in particular surfaces which have been obtained by sawing by means of MWS (unidirectional and bidirectional), ID, GS or web saws. However, it is also possible to process surfaces which have already been ground or even have already been polished. In particular, the 1S-DDG eliminates the roughening of the surface which has always been considered necessary in the processes according to the prior art in the roughing step, in order to produce an "engagement roughness" in particular on smooth surfaces resulting from successful preceding separating processes (precision separating) for the subsequent finishing step, i.e. to produce roughness on which the fine abrasive grain of the precision-grinding step can engage.

The 1S-DDG process is highly tolerant of fluctuations in the quality of the starting wafers with regard to roughness, thickness or geometry without requiring additional amounts of material to be removed. In general, the 1S-DDG step avoids the above-described drawbacks of the multistage mechanical machining processes according to the prior art, so that considerable amounts of material can be saved during operation.

At the same time, the collinear arrangement of the two spindle axes in the double-side grinding process makes it possible to achieve a high final thickness dimensional accuracy of the semiconductor wafers after the double-side polishing.

According to the invention, there is no further preliminary machining or remachining by lapping, single-side grinding (SSG), sequential single-side grinding of both sides of the wafer (2×SG) or any other machining step which shapes by predominantly mechanical, chip-removing removal of material, as is required according to the prior art. This does not rule out edge rounding or edge polishing carried out before or after the grinding step, since these processes do not machine the surfaces of the semiconductor wafer, but rather its edge.

According to the invention, the semiconductor wafer can be produced using a particularly small number of individual machining steps. The small number of individual machining steps result in considerable advantages with regard to flexibility of production (rapid reaction to a very wide range of customer specifications), logistics (less material in the line; more rapid availability), etc. Furthermore, the semiconductor wafer is produced particularly economically in terms of material. The preparation of the single-crystal semiconductor ingot results in a considerable proportion of the overall production costs of a semiconductor wafer. A reduced loss of material during the subsequent machining of the single-crystal ingot in the numerous steps involved before the semiconductor is finished therefore results in a considerable cost saving.

According to the prior art, the step of double-side grinding (double-disk grinding, DDG) has only ever been considered for use for machining sequences which had to include further mechanical premachining or remachining of the semiconductor wafer by lapping, single-side grinding or sequential single-side grinding. Until now, there has been no attempt to use DDG as a central mechanical planarization step. surprisingly, however, it has been found that the required properties can be achieved with single-step simultaneous double-side grinding, 1S-DDG. The process according to the invention therefore allows the production of semiconductor wafers with a high yield and without loss of quality. Furthermore, the process according to the invention provides advantages which the process sequences according to the prior art do not have or lose precisely as a result of the combination of a plurality of steps.

A particular advantage of the process according to the invention is that the semiconductor wafers are machined by cross-grinding in the 1S-DDG process. This means that, during grinding, grinding marks of the individual abrasive bodies which intersect one another are formed—unlike with track-grinding, for example in SSG processes, in which only parallel grinding marks are formed. Cross-grinding and its properties determine the starting morphology of the semiconductor wafers for the subsequent chemical machining by etching or chemical-mechanical polishing. A plurality of positive properties are brought about by the cross-grinding:

The removal of material with cross-grinding kinematics is quicker and therefore less expensive than with track grinding, for example in the case of the machining in accordance with the prior art by means of SSG, 2×SSG or a combination of DDG and SSG or 2×SSG.

Cross-grinding is more crystallographically isotropic than track-grinding. Because of the directional properties of a single crystal (crystallographic anisotropy), there are distinct directions which are easier to machine and more difficult to machine. In the case of cross-grinding, there is no more material removed in the crystallographic directions which are easy to machine than in the crystallographic directions which are more difficult to machine, since at any point of the surface of the machined wafer grinding marks with different directions constantly cross one another, so that all the individual cutting rates which are dependent on crystal orientation end up being averaged out.

In the case of track-grinding, which does not have paths which cross one another, the crystallographic machining angle is dependent on the location on the semiconductor wafer. Therefore, different amounts of material are removed from different locations. This is limited only by the rigidity of the grinding disk, which prevents excessively inhomogeneous thinning of the semiconductor wafer. In the case of track-grinding, a very long-range pattern is formed, the preferential directions of which reflect the crystal symmetry. In the case of a silicon surface which is parallel to the crystal plane <100> (Si<100>), for example, a cross is formed, while in the case of Si<111>, a six-pointed star is formed. Long-wave geometry disruptions of this nature cannot be removed during the subsequent machining steps, or can only be removed with considerable removal of material. An undesirable "grinding cross", which is noticeable both qualitatively, in particular using the so-called magic mirror measurement method, and quantitatively, for example by means of interferometry or laser triangulation, remains on the finish-machined semiconductor wafer.

In machining combinations of DDG and SSG or 2×SSG according to the prior art, the second SSG step determines the surface morphology of the wafer. Therefore, the advantageous cross-grinding produced by the DDG is no longer available to the selectively acting chemical or chemical-mechanical subsequent machining processes in machining sequences according to the prior art. These subsequent machining processes in fact develop the grinding cross by preferentially attacking the crystal lattice regions which have been weakened by the mechanical machining.

Within the context of the invention, it is preferable to use a simultaneous double-side grinding process which employs a workpiece mount which holds and moves the semiconductor wafer virtually without forced guidance (free-floating process, FFP). The general advantages of FFP machining, which result from the elimination of restrictive forced conditions caused by nonpositively or positively locking tool mounts, which are generally themselves subject to faults, are known, for example, from (double-side) lapping and double-side polishing (DSP) and are described by way of example of a typical application, with regard to the properties which are characteristic of DSP, by J. Haisma et al. (Appl. Opt. 33 (34) (1994) 7945).

Furthermore, the use of grinding wheels with a hard, ceramic bonding is preferred within the context of the invention. Because of their rigidity, such wheels lead to a particularly high final-thickness dimensional accuracy of the semiconductor wafers. Moreover, the ceramic-bonded grinding disks in 1S-DDG prevents surface contamination in the form of abraded plastic material and surface or volume contamination, for example by metals. The absence of abraded plastic, as occurs, for example, when resin-bonded grinding disks are being used, makes it possible to dispense with a subsequent "deep-cleaning step", for example by material-removing etching.

A precondition for omitting the etching step is a sufficiently smooth finish after the grinding, since the etching also reduces the surface stress which is attributable to the crystal damage caused by the mechanical machining. If the crystal stress and the density of the defects are too high, the mechanical loads during polishing, particularly in the case of "free-floating" DSP with the freely movable semiconductor wafers, cause these defects to propagate and persist even in the end product.

Therefore, for the process according to the invention, it is preferable to use a particularly fine abrasive grain which ensures a low roughness of the wafer surface after the 1S-DDG process. However, the fact that direct machining of the starting surface of the semiconductor wafer (i.e. for example after cutting of the single-crystal ingot by means of MWS) by means of 1S-DDG must still be possible, which is easier the coarser the abrasive grain used, sets a limit with regard to the fineness of the abrasive grain. These contrary demands are satisfied by special ceramic-bonded grinding disks, which are preferable to use for the process according to the invention. Grinding disks with an abrasive grain size corresponding to US mesh or JIS mesh #2000 (and corresponding FEPA standards; approximately 4–6 μm mean grain size) or finer are particularly preferably used. It is also particularly preferred for the bonding hardness and porosity, abrasive grain density and distribution curve and a few other materials parameters and process parameters used in 1S-DDG, such as spindle advance and strategy and the removal rate to be matched to the material being machined.

After the machining substep of 1S-DDG, semiconductor wafers which are produced in accordance with the invention have a low surface roughness and a low density and depth of the remaining crystal-lattice defects (damage). For example, in a preferred embodiment of the process according to the invention, roughnesses of around 400 Å RMS are achieved with a ceramic-bonded grinding wheel with #2000 abrasive grain sieve (4–6 μm grain size) and roughness of about 100 Å RMS are achieved with a 1.5 μm grain size. Furthermore, roughness of about 50 Å RMS have been achieved using a grinding-wheel prototype in a single 1S-DDG machining operation in accordance with the invention. This can be compared with the fact that single-side grinding (track-grinding) cannot achieve a roughness of significantly below 500 Å RMS even when operated with a resin-bonded grinding wheel which provides the finest possible material-removal rates which are still economically viable and is also self-sharpening (does not clog) in accordance with the prior art. (Measured values taken from a profilometer with a 1 μm diamond stylus in <80 μm high pass.) The roughness is in particular so low that even a material-saving follow-up polishing removal is able to supply the desired end finish. Moreover, there can be no defect propagation as a result of the mechanical load during polishing, so that the crystal defects which do remain do not persist all the way through to the end product.

In principle, the 1S-DDG process according to the invention allows near net shape precision machining. The fact that there is no chuck means that there is no damage to the ground semiconductor wafers caused by bearing contact and therefore also no scratches, etc., which would have to be removed in material-intensive fashion or repaired.

After the 1S-DDG machining substep, the semiconductor wafers have an extremely low thickness scatter around the process target value. The invention therefore also relates to a semiconductor wafer which, immediately after a simultaneous double-side grinding of the semiconductor wafer in one step, has a deviation from the desired mean target thickness (thickness, <THK>) of $\Delta THK \leq 0.75$ μm ($\Delta THK$=standard deviation of the mean wafer thickness <THK> in the test batch) and a total thickness variation (TTV) of $TTV \leq 1$ μm.

Furthermore, after the 1S-DDG machining substep, the semiconductor wafers are extraordinarily rotationally symmetrical, i.e. the thickness distribution which gives the remaining TTV value within a semiconductor wafer is almost completely determined by a radially symmetrical (one-parameter) cross-sectional profile. Therefore, the invention also relates to a semiconductor wafer which, immediately after simultaneous double-side grinding of the semiconductor wafer in one step, has a rotational asymmetry $\Delta ROT \leq 0.5$ μm.

By definition, the rotational asymmetry $\Delta ROT$ which is due to a residual angle-dependency of the thickness distribution must always be less than or equal to the total thickness variation TTV. In grinding processes according to the closest prior art, a significant contribution to the total thickness variation $$TTV = \max_{\Phi, r}\{THK(\Phi_1, r_1) - THK(\Phi_2, r_2)\}$$

actually results from a rotational asymmetry $\Delta ROT$, for example a wedge shape of the semiconductor wafer, for example as a result of a tumbling chuck (vertical movement) in the case of single-side grinding.

In a similar manner to the TTV, $\Delta ROT$ can be defined as $$\Delta ROT = \max_{r}[\max_{101}\{THK_r(\Phi_1) - THK_r(\Phi_2)\}]$$

where $\max_{\Phi, r}$ denotes the maximum height difference $THK(\Phi_1, r_1) - THK(\Phi_2, r_2)$ obtained when angle $\Phi$ and radius r are varied, $\max_\Phi$ denotes the maximum obtained when $\Phi$ is varied and r is fixed and $\max_r$ denotes the maximum obtained when r varies and $\Phi$ is fixed, and $THK_r(\Phi)$ indicates the local thickness THK as a function of $\Phi$ with r fixed.

Due to their good target thickness dimensional accuracy, the semiconductor wafers according to the invention are particularly suitable for direct further processing by polishing. In the vast majority of cases, prepolishing is a multiwafer process in which a multiplicity of wafers are machined simultaneously and in parallel on a polishing plate in one machining run. A very uniform starting thickness of the semiconductor wafers which pass into a multiwafer polishing process of this type is an imperative condition for a successful polishing process which is distinguished by uniform removal of material and constant, good geometry and nanotopology for all the wafers in the polishing batch. This condition is only satisfied if the individual polishing kinematics of all the wafers are identical in a polishing run. Particularly in the case of double-side polishing, in which the wafers rest loosely in thin guide cages and are polished, as it were, floating freely between two polishing plates, any scatter in the starting thicknesses leads to an uneven distribution of load on the individual wafers. This leads to an increased risk of fractures, since the thickest wafers absorb most of the load from the polishing plates at the start of the polishing process.

Furthermore, a considerable scatter in the starting thicknesses leads to different kinematics from wafer to wafer, i.e. to individual movements: thick wafers rotate quickly, thin ones rotate slowly. In the individual wafers, this in turn leads to different geometries after the double-side polishing.

Moreover, the fluctuation in the starting thickness increases the minimum amount of material which it is necessary to remove during multiwafer polishing in order to achieve a substantially homogeneous starting thickness with an acceptable geometry and other wafer properties.

Removing material by polishing is very cost-intensive. Therefore, polishing processes which are as short as possible are preferred. Consequently, a very homogeneous starting thickness is required, such as that provided by the 1S-DDG process. In a combined process comprising, for example, DDG roughing and SSG or 2×SSG finishing, the inherent advantage of the DDG method, mainly that it provides identical wafer starting thicknesses, is negated by the remachining by the SSG or 2×SSG, since the SSG is inherently only able to provide final thickness stabilities which in relative terms are not as good. This is due to the collinearity of the grinding-spindle axes in the case of DDG compared to the offset in the axes between the chuck and grinding spindle in the case of SSG. The collinearity in the case of DDG makes the process immune to fluctuations in the instantaneous cutting rates of the grinding wheels, is inherently rigid and resistant to torsion. If the cutting rate of the grinding wheels varies naturally, the offset in the axes leads to the axes tilting with respect to one another and to elastic torsion in the machine, compensating for the counterpressure of the pressures which build up as a result of the grinding-spindle infeed.

Furthermore, accurate measurement of the instantaneous workpiece thickness during the process (in-process gauge) is only possible with DDG, since in this case both sides of the wafers are freely accessible during the machining. In the case of SSG, one side of the wafer is held on a chuck, which prevents accurate measurement of the instantaneous thickness, since the space which remains at some points between the upper side of the chuck and the workpiece underside, resulting from the lack of planarity of the generally undulating semiconductor wafers on the chuck, is unknown, and furthermore residual vertical movements and unevenness of the chuck itself distort the thickness measurement. The measurement of the current wafer thickness is additionally made more difficult by the fact that in a 2×SSG process, a soft chuck and a hard chuck are typically used alternately, and thickness measurement on a soft chuck is generally not possible with any great accuracy.

After the 1S-DDG machining substep, the semiconductor wafers have a high target dimensional accuracy. This means that the actual shape of the semiconductor wafers after the 1S-DDG deviates only slightly from the desired shape which forms the starting shape for the subsequent machining step of polishing or optionally of etching. Furthermore, the residual shape deviations which may still remain after 1S-DDG are always of a type which is particularly uncritical for the subsequent processes.

For example, double-side polishing (DSP) reacts more critically to residual rotational asymmetry $\Delta ROT$ of the wafer thickness THK than to its total thickness variation TTV obtained from randomly distributed local thicknesses $THK = THK(\Phi, r)$ (in each case for comparable values for $\Delta ROT$ and TTV), since the DSP itself produces rotationally symmetrical wafer geometries and similar rotational asymmetries (for example a wedge shape) can only effectively be removed by additional polishing involving the removal of further material. Generally, even the optimum starting shape for the subsequent machining often deviates from that of an ideal planar wafer, particularly if specific characteristics of the subsequent processes can be compensated for in advance by targeted deviations in the shape. An example which can be mentioned is once again DSP, which, under certain conditions and deviating from the desired (and achievable) ideal of a plane-parallel surface, tends to form rotationally symmetrical but convexly curved surfaces ("biconvex lens") and therefore profits from a surface which is deliberately curved concavely—and is likewise necessarily rotationally symmetrical—after 1S-DDG ("biconcave lens").

Since the shortening of the overall process sequence brought about by the use of 1S-DDG means that the ground wafer is closer to the finish of the fully machined wafer, the point of good geometry is of considerable importance even after the mechanical shaping machining. Since the subsequent processes in the process sequence according to the invention no longer cause any significant changes in the wafer geometry, particularly in the case of short process sequences with a considerably reduced amount of material removed during the polishing, a particularly planar wafer after the mechanical machining step, as provided by the 1S-DDG process, is generally advantageous.

A preferred process sequence according to the invention for the production of semiconductor wafers includes the following substeps:

a) separating a semiconductor ingot into a multiplicity of semiconductor wafers;

b) rounding the edges of the semiconductor wafers;

c) simultaneously grinding both sides of the semiconductor wafers, 1S-DDG; and d) polishing the semiconductor wafers, where step c) is the only material-removing mechanical machining step used to machine the surfaces of the semiconductor wafers.

Step a) is a separating step in which a unit in wafer form is separated from a pulled single crystal which has been made dimensionally accurate. This separating step is carried out in accordance with the prior art and may be a sequential separating process (one wafer after another) or a simultaneous separating process (all the wafers of one cut batch simultaneously). Sequential separating processes are carried out, for example, using internal-diameter saws (ID) or band saws. The simultaneous sawing of the wafer and grinding of the ingot end surfaces, i.e. of the surface of the semiconductor wafer which is formed (grind-slicing, GS) is also possible. Within the context of the process sequence according to the invention, however, a simultaneous separating process by means of a wire saw (multi-wire slicing, MWS), optionally using a cutting suspension (slurry cutting-lapping, S-MWS) or a wire with bonded abrasive grain (e.g. diamond wire cutting-lapping, D-MWS) is preferred within the context of the process sequence according to the invention. Advantages of the MWS process are low costs, high throughput and usability even for relatively large ingot diameters. The drawbacks which are typical of MWS, for example sawing undulations, are particularly advantageously eliminated in the process according to the invention by the subsequent double-side grinding step.

In step b), the wafer edge is profiled (edge/notch rounding, chamfering). This step can be selected as desired from the processes of the prior art. It is possible to consider grinding using a profiled abrasive body, grinding with movement of the contours of the semiconductor wafer on an abrasive body or roller, belt or cloth grinding. In particular, it is also possible to use edge precision rounding or an integrated process involving edge chamfering and edge polishing. In the case of conventional rough rounding, an edge/notch polishing step may have to be included at a suitable point during the further machining sequence.

Alternatively, the edge-rounding may also be carried out after the 1S-DDG. Drawbacks of this alternative are the increased difficulty of workpiece handling during the 1S-DDG, on account of the wafer diameter not yet being dimensionally accurate and of the sharp edge of the wafers, and the danger to the surface finish on the semiconductor wafer which is achieved by 1S-DDG as a result of the wafer having to be clamped again during the subsequent edge-rounding. On the other hand, there is the advantage that, during edge-rounding, it is possible to use integrated chamfering and precision-rounding processes (grinding and polishing) as described, for example, in JP 08090401 A.

Step c) is the 1S-DDG process which has been described extensively above.

Step d) is a polishing process according to the prior art. It generally comprises prepolishing and final polishing, which are therefore considered separately below. The prepolishing may be a multiwafer or single-wafer polishing process and may be a single-side or double-side polishing process. The double-side polishing process may be a sequential single-side polishing process (back surface first, followed by front surface) or a simultaneous double-side polishing process (DSP). All combinations of single-wafer and multiwafer, single-side and double-side polishing processes are possible. Until now, only multiwafer DSP has formed part of the prior art in connection with DSP. The final polishing is generally carried out as single-side polishing.

The following machining sequences according to the invention using different polishing processes in step d) are preferred: the polishing may comprise a sequence of double-side prepolishing—single-side final polishing of the wafer front surface. In addition, it is possible to use machining sequences in which both sides of the semiconductor wafer undergo single-side polishing sequentially and then the front surface of the semiconductor wafer undergoes the final polishing. The single-side prepolishing and single-side final polishing may take place separately from one another or may be coupled. For example, it is possible for the prepolishing of the back and front surfaces to be carried out in one machine or in one process. Alternatively, it is possible to use a combination of front-surface prepolishing and front-surface final polishing in one machine or in one process. A machining sequence in which only the front surface of the semiconductor wafer is prepolished and then final-polished is also possible. Single-surface prepolishing and single-surface final polishing may once again take place in isolated fashion (e.g. on separate machines) or in integrated form (e.g. on one machine with different polishing plates between which the semiconductor wafer is transferred directly, without an interruption to the process or any loading and unloading operations, if appropriate with a cleaning step carried out in between).

An etching or (deep) cleaning step, in which material is removed from the wafer surface by chemical means, either simultaneously on both sides or sequentially on one side or only on one side (e.g. using a spin-etch process), may optionally be added between the double-side grinding c) and the polishing d). In this way, if necessary, crystal-lattice damage and surface stresses are reduced and contamination is removed. However, a machining sequence without an etching step is preferred. This saves material, time and costs and simplifies the process sequence. Furthermore, the deterioration in the wafer geometry achieved during mechanical machining, which always occurs as a result of etching, is avoided.

In addition, a wide range of further steps, such as cleaning, classifying, measuring and packaging steps may be carried out, but these have no influence on the planarity of the wafer surface. Furthermore, the wafer surface may be coated after the final polishing, for example by epitaxy.

The finish-machined semiconductor wafer according to the invention, for example after fine polishing, has an excellent local flatness (nanotopology). The invention therefore also relates to a semiconductor wafer with a maximum unevenness on the wafer front surface of less than 20 nm in any desired measurement field of a size of 2 mm×2 mm and of less than 50 nm in any desired measurement field with a size of 10 mm×10 mm.

Consequently, the wafer is particularly suitable for subsequent further processing with a high yield to form particularly high-quality components which have been produced using the CMP process. This CMP process reacts particularly critically to residual unevenness in the abovementioned short range.

The process according to the invention also leads to a good nanotopology in particular if in step a), during cutting of the semiconductor ingot using a wire saw (multi-wire slicing, MWS), the saw wire breaks and therefore has to be replaced by a new wire. After cutting, this leads to a noticeable step in the thickness profile of the wafers. According to the prior art, "wire-breakage" wafers of this type cannot be used for high-grade applications and are generally scrapped, with correspondingly serious consequences for the overall production costs, since a broken wire always affects all the wafers in a sawn batch, i.e. approximately 200 to 300 wafers simultaneously. The process according to the invention is able to process even these wafers into high-quality end products.

A further particularly advantageous property of the semiconductor wafers which have been produced in accordance with the invention is their high flatness all the way to the outermost edge. In particular, they have good geometry characteristics even for the edge region which has previously been excluded when assessing the wafer surface (edge exclusion, EE). Currently, the edge exclusion is typically 3 mm. In the semiconductor wafers which are produced according to the invention, the quality deteriorates only slightly as the size of the specified surface area increases—for example to edge exclusions of 2 mm (expected standard), 1 mm (future) and 0.5 mm.

In particular, the wafers which are produced in accordance with the invention do not have any "edge drop", i.e. do not have any convexity or narrowing of the thickness toward the edge of the wafers. In the case of SSG or 2×SSG, the large grinding-disk diameters which are required for those processes cause an edge drop of this type to occur. The diameters of the grinding disks used in SSG are typically greater than the diameters of the semiconductor wafers which are machined. This is necessary in order to approach the ideal of a cutting path which runs as far as possible in a straight line over the diameter of the wafer. This counteracts the instability caused by the nonuniform introduction of force during grinding as a result of the offset in the axes of the chuck and the grinding spindle. Accordingly, the large grinding disk which is required for SSG grinds almost vertically into the wafer surface over the edge of the wafer. Vertical, rapid grinding engagement at the wafer surface leads to microscopic edge flaking at the structurally weaker edge.

Moreover, SSG, as a result of the grinding kinematics of what is known as track-grinding (parallel grinding marks which do not cross one another), leads to weakening of the crystal lattice at the wafer edge, and this weakening, during the subsequent machining, for example by chemical etching or chemical mechanical polishing, causes increased amounts of material to be removed at the wafer edge.

In the case of SSG, the non-crossing, radial track-grinding is usually forcibly imposed by concave clamping of the workpiece on the slightly convex chuck and corresponding slight inclination of the chuck or spindle axis with respect to one another. In principle, cross-grinding is also possible with SSG. However, this is disadvantageous, since the chuck/spindle axial offset and the resulting inherent tendency to instability means that even less uniform engagement, with vibrations, stick-and-slip, etc. would occur than when operating with a deliberately preimposed orientation of the axes.

However, in the case of DDG it is advantageously possible for smaller grinding disks, with diameters in the region of half the diameter of the semiconductor wafers being machined, to be used. This is possible because the axes of both grinding-wheel spindles are precisely aligned with one another (collinearity) and, unlike in SSG, all the forces are precisely compensated for in the case of DDG. This leads to the abrasive bodies grinding into the wafer surface almost parallel to the edge of the wafer and therefore very gently, at small grinding angles. This reduces the likelihood of microflakes at the edge. Moreover, cross-grinding of the DDG means that there is no crystallographically preferential crystal-lattice damage with inhomogeneous removal of material during subsequent steps in the edge region.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views:

FIG. 1 shows a microscopic image of the wafer surfaces of one silicon wafer which has been produced in accordance with the invention and has undergone double-side grinding (FIG. 1(A)), and a silicon wafer which has been produced in accordance with the prior art (FIG. 1(B)), in each case after mechanical machining has been completed;

FIG. 2 shows the surface profiles in the edge region of a silicon wafer which has been produced in accordance with the invention and has undergone double-side grinding (FIG. 2(A)) and a silicon wafer which has been produced in accordance with the prior art (FIG. 2(B)), in each case after the mechanical machining has been completed;

FIG. 3 shows the nanotopology of a silicon wafer which has been produced according to the invention after polishing has been completed (FIG. 3(A)) compared to a silicon wafer which has been produced in accordance with the prior art, likewise after polishing has been completed (FIG. 3(B)); and FIG. 4 shows the same comparison as in FIG. 3, except that the silicon wafers originate from a piece of ingot in which the saw wire had torn during cutting by the wire saw (MWS).

DETAILED DESCRIPTION OF THE PREFERRED EMBODIMENT

EXAMPLE 1

In accordance with the invention, a silicon wafer was produced by being cut with a wire saw from a single crystal which had been made dimensionally accurate, with a nominal diameter of 300 mm, edge-rounding, 1S-DDG using grinding wheels with ceramic-bonded abrasive grain of a size of #2000 (approx. 4–6 µm), etching using a suitable mixture of hydrofluoric acid and nitric acid in an etching installation with laminar flow of the etching mixture over the wafer surface, double-side prepolishing and single-side final polishing, in accordance with the invention.

Figure 1A:
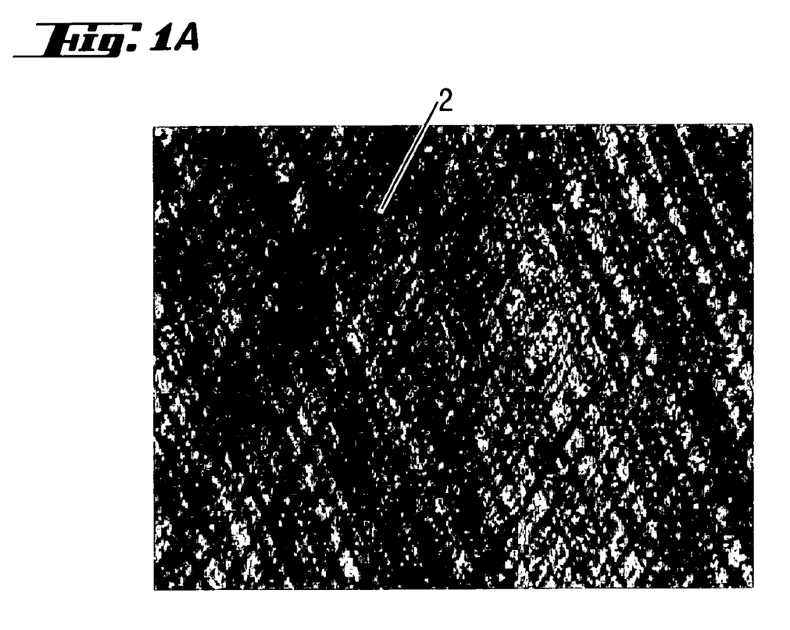

FIG. 1(A) shows an enlarged view (under the microscope) of the surface of the silicon wafer after the 1S-DDG machining substep. The grinding marks 2 from the 1S-DDG machining, which cross one another, are clearly visible. There is no abraded material or contamination on the surface, and this, together with the low roughness and depth of damage, obviates the need for subsequent etching or subsequent deep cleaning. The surface is clean and homogeneous.

Figure 2A:
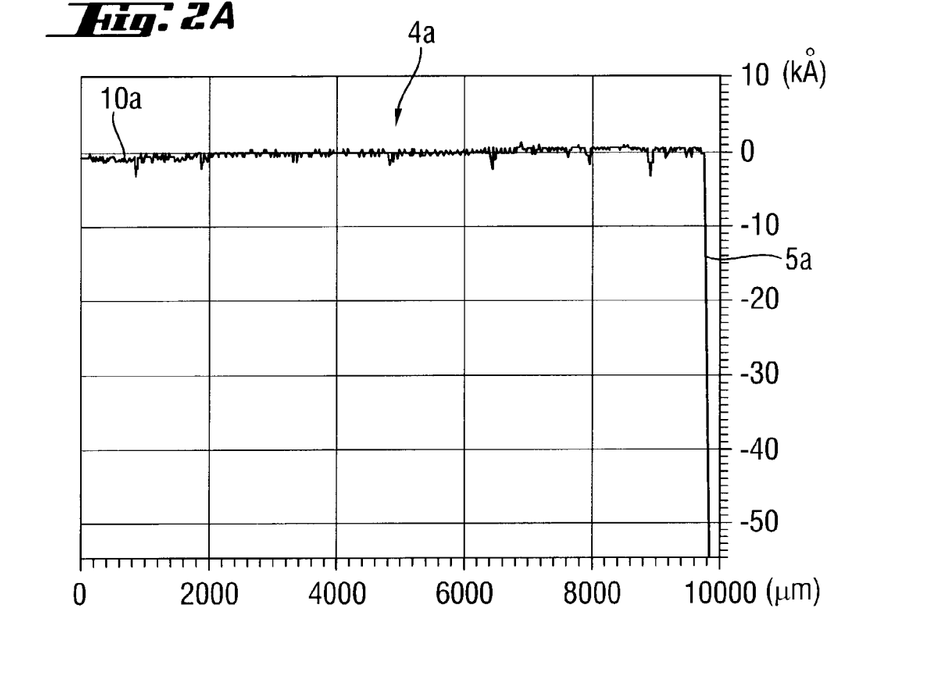

FIG. 2(A) shows a quantitative representation of the edge region of the silicon wafer after the 1S-DDG machining substep, in the form of a profilogram recorded using a scanning probe. The good flatness 10a all the way to the edge of the wafer can be clearly recognized, with the abrupt transition between wafer surface 4a and the wafer edge 5a, which had already been deliberately rounded. The chamfer produced during the edge-rounding can be seen at the virtually vertically downward line resulting from the sensitive height scale (units: 10 kÅ=1 µm).

Figure 3A:
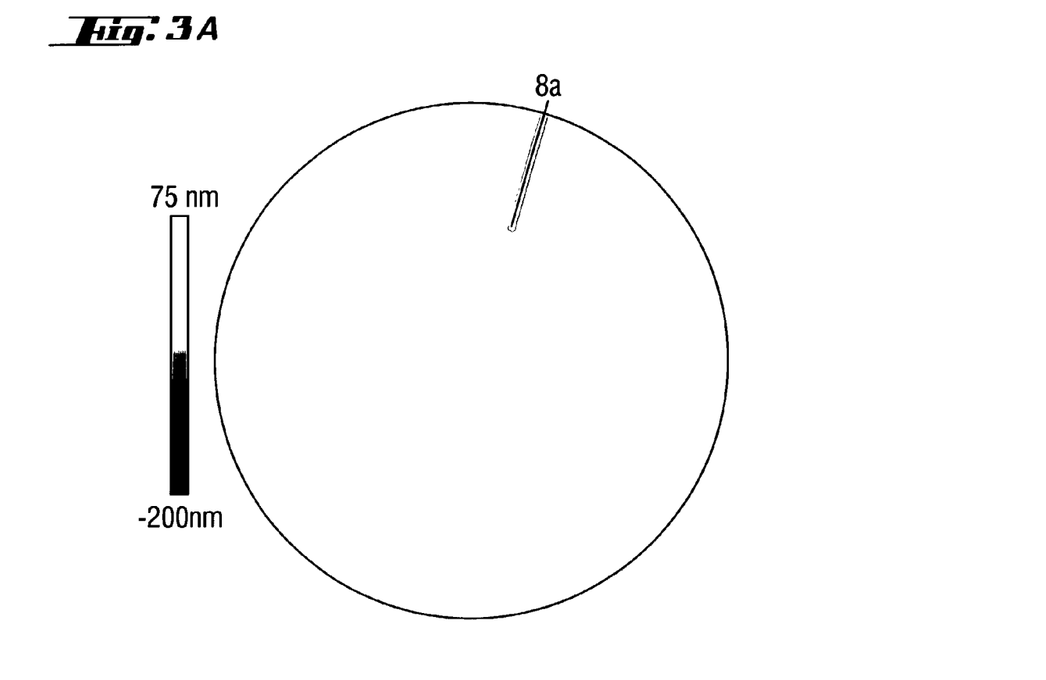

The front surface of the fully machined, polished silicon wafer is illustrated in FIG. 3(A). The gray-scale representation of the local height deviations (−200 nm to +75 nm) was obtained from an interferometry examination method. The surface is virtually perfectly flat (8a). In particular, in any desired measurement areas of 2 mm×2 mm and 10 mm×10 mm over the entire surface, all the local height deviations are less than 20 mm or less than 50 mm, respectively. The gray scales indicate absolute heights on the surface, with the zero height corresponding to a regression surface.

Comparative Example 1

A silicon wafer was produced in a similar manner to Example 1, except that during the mechanical machining step the 1S-DDG process was replaced by sequential single-side grinding carried out twice (2×SSG). The 2×SSG process comprises a first soft-chuck grinding step, followed—after dechucking, turning and intermediate cleaning of the silicon wafer—by a second, hard-chuck grinding step. A resin-bonded grinding wheel with abrasive grain of a size of 15 µm (approximately #1200) was used. Moreover, an acidic laminar-flow etching step which removed a total of 20 µm of material took place between the mechanical machining and the polishing.

Figure 1B:
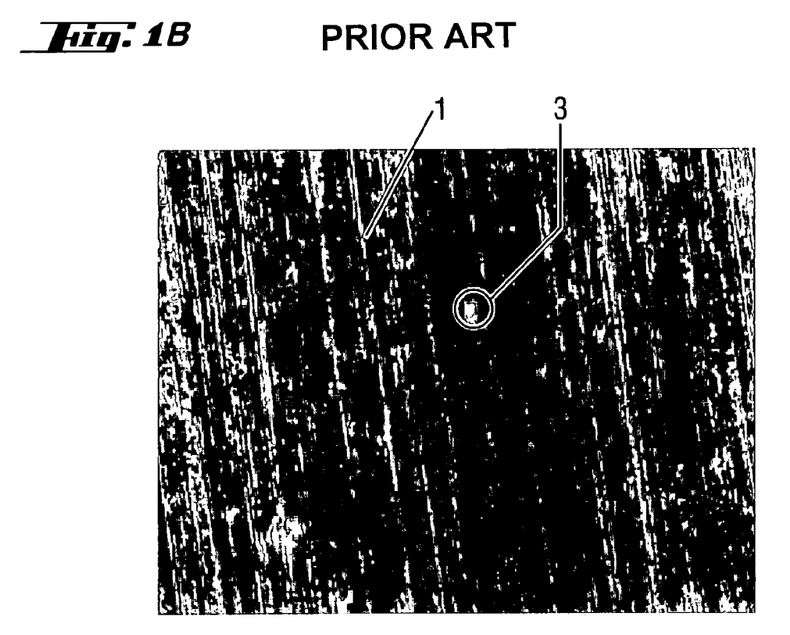

FIG. 1(B) shows an enlarged view (under the microscope) of the surface of the silicon wafer after the mechanical machining. The individual grinding marks 1, which are approximately parallel and do not intersect one another, are clearly evident. The abrasion 3 of the resin bonding of the grinding wheel requires subsequent material-removing deep cleaning or an etching step. During these additional steps, elevated areas of material remain in place as a result of masking at locations where abrasion has occurred, and these have an adverse effect on the roughness and require a correspondingly greater amount of material to be removed.

Figure 2B:
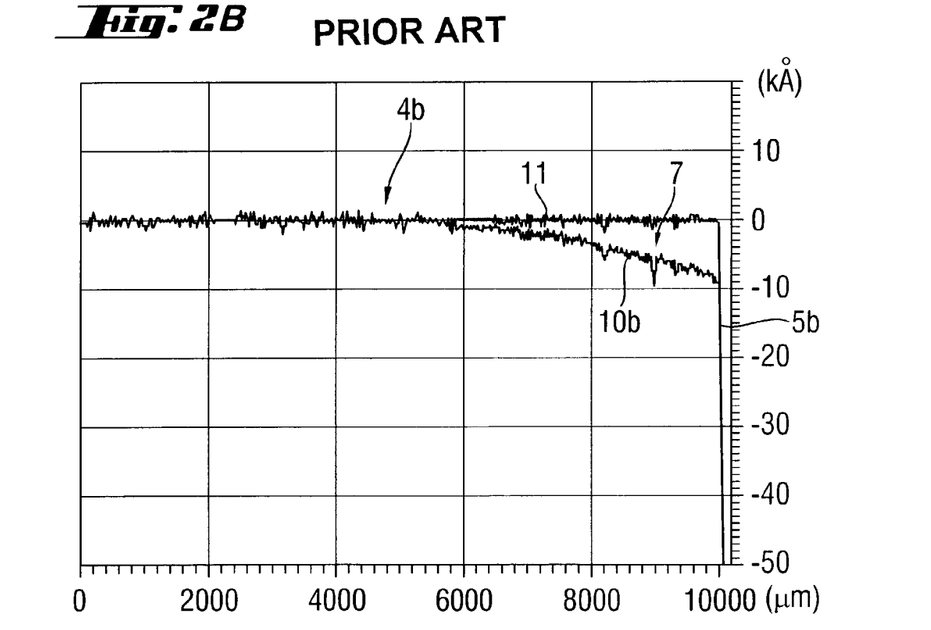

A profilogram 10b of the edge region of the wafer surface after the mechanical machining is shown in FIG. 2(B). The grinding process used means that there is a premature drop 7 on the wafer surface 4b toward the edge region 5b, which has previously been deliberately rounded. For the edge exclusion of 3 mm which is currently customary (in this illustration approximately at x=7000 µm), the undesired edge drop 7, with a deviation of approximately 3 kÅ=0.3 µm, does not yet make a decisive difference to the total flatness of the silicon wafer. With future, reduced edge exclusion zones of 2 mm (in this case approximately at x=8000 µm, deviation Δy there being approximately 4 kÅ=0.4 µm), 1 mm (x~9000 µm, Δy~6 kÅ=0.6 µm) or 0.5 mm (x~9500 µm; Δy~8 kÅ=0.8 µm) and further increased demands on the flatness of the overall surface of the wafer, this edge drop 7 will make its presence clearly felt in terms of a reduction in quality and yield. The unfiltered profilogram 10b and a high-pass filtered roughness curve 11 are shown.

Figure 3B:
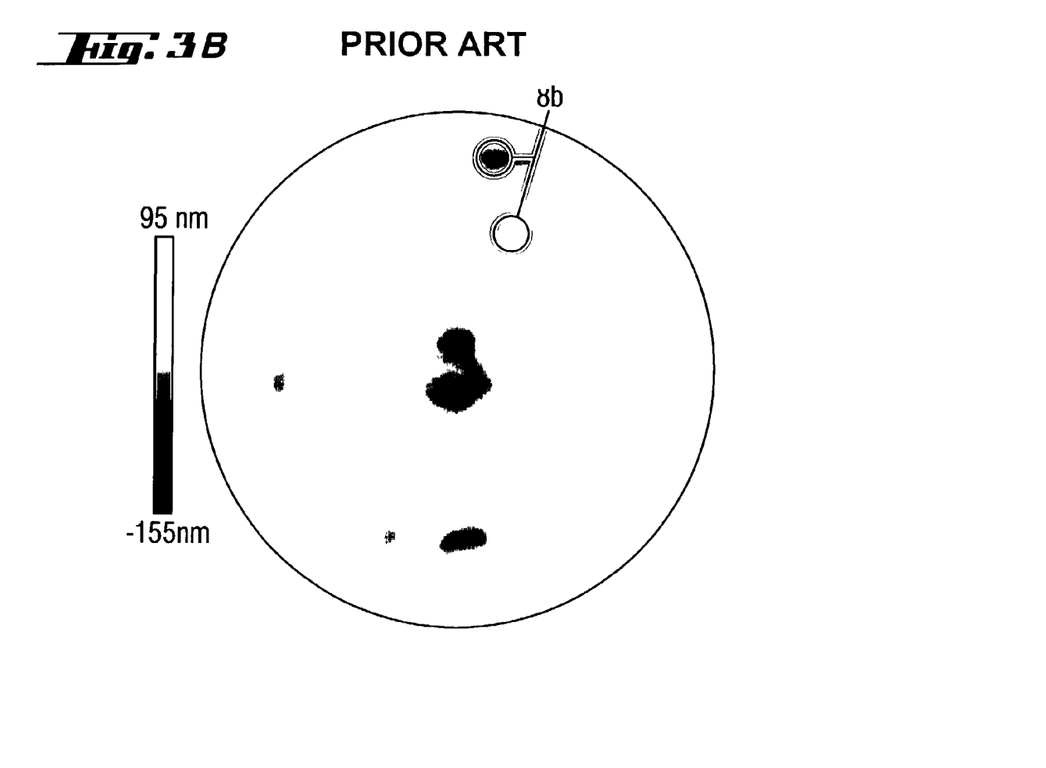

FIG. 3(B) shows the nanotopology of the fully machined silicon wafer. The gray-scale representation from −155 nm to +95 nm once again originates from an interferometry examination method. Pronounced short-range local deviations in height (8b) are clearly visible, and within selected measurement fields of 2 mm×2 mm or 10 mm×10 mm their sizes are often above 20 nm or 50 nm, respectively. A semiconductor wafer of this type, produced in accordance with the prior art, is too demanding for further processing and is unsuitable for very large scale integrated microelectronic multilayer components and in particular the chemical mechanical polishing (CMP) process which is used for such components.

EXAMPLE 2

Figure 4A:
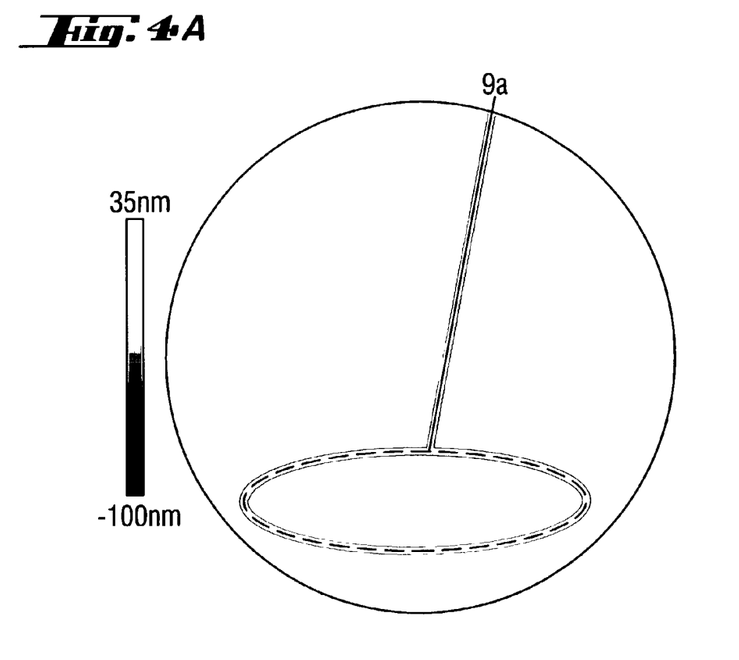

A silicon wafer was produced in accordance with the invention, in a similar manner to that described in Example 1. The only difference from Example 1 is that the saw wire broke during cutting of the silicon single crystal by MWS, and the cutting operation was continued after a new wire had been fitted. Thermal drift and a number of other reasons meant that the process interruption always leads to a pronounced step in the thickness profile of the wafers cut in this way. However, the further processing eliminated this step almost completely, as shown by the interferogram illustrated in FIG. 4(A). The surface of the end product is almost perfectly flat (8a).

Comparative Example 2

Figure 4B:
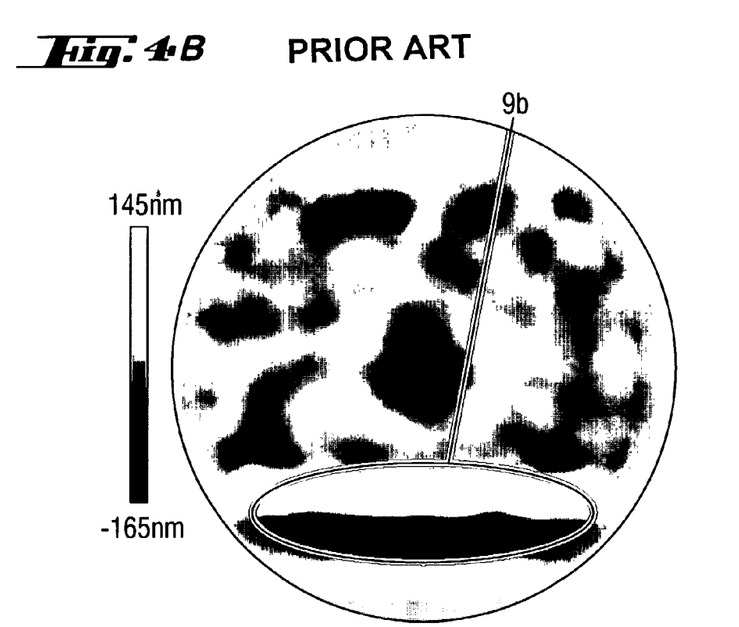

A silicon wafer from the sawn batch of Example 2, in which the wire tear had occurred, was processed further in accordance with the prior art, in a similar manner to that described in Comparative Example 1. FIG. 4(B) shows the interferogram for the fully machined silicon wafer. Even using the considerably greater height scale compared to FIG. 4(A) (−165 nm to +145 nm compared to −100 nm to +35 nm in FIG. 4(A)), the step which was formed when the wire tore is still clearly visible as a serious local deviation in height on the fully machined wafer, i.e. after polishing. A wafer of this type, produced in accordance with the prior art, and therefore the entire sawn batch in which the wire breakage had occurred, is too demanding for further processing, and is unsuitable for very large scale integrated microelectronic multilayer components, particularly if a chemical mechanical planarization (CMP) process is used for production of these components.

Accordingly, while only a few embodiments of the present invention have been shown and described, it is obvious that many changes and modifications may be made thereunto without departing from the spirit and scope of the invention.

What is claimed is:

1. A semiconductor wafer produced by simultaneously grinding both sides of the semiconductor wafer in one step, 1S-DDG, forming a cross ground pattern of grinding marks on each side of the wafers using ceramic-bonded grinding wheels, and measuring the thickness of the workpiece during grinding, said wafer having a deviation from a desired target thickness THK of $\Delta THK \leq 0.75$ µm, a geometry value of $TTV \leq 1$ µm and a rotational symmetry of $\Delta ROT \leq 0.5$ µm.

2. A semiconductor wafer having a maximum unevenness on a wafer front surface of less than 20 nm in any desired measurement field with a size of 2 mm×2 mm and of less than 50 nm in any desired measurement field of a size of 10 mm×10 mm.

3. The semiconductor wafer of claim 2, wherein the maximum unevenness criteria are satisfied apart from an edge exclusion of 0.5 mm.

* * * * *